(12) United States Patent
Handley et al.

(10) Patent No.: US 6,766,338 B1
(45) Date of Patent: Jul. 20, 2004

(54) HIGH ORDER LAGRANGE SAMPLE RATE CONVERSION USING TABLES FOR IMPROVED EFFICIENCY

(75) Inventors: Stephen R. Handley, Houston, TX (US); Jeffrey Scott Hayes, Houston, TX (US); Rocky Chau-Hsiung Lin, Fairfield, OH (US)

(73) Assignee: Texas Instruments Incorporated, Dallas, TX (US)

( * ) Notice: Subject to any disclaimer, the term of this patent is extended or adjusted under 35 U.S.C. 154(b) by 571 days.

(21) Appl. No.: 09/713,419

(22) Filed: Nov. 15, 2000

Related U.S. Application Data

(60) Provisional application No. 60/171,358, filed on Dec. 22, 1999.

(51) Int. Cl.[7] .............................................. G06F 17/17
(52) U.S. Cl. .......................................... 708/313; 341/61
(58) Field of Search ............................ 708/313; 341/61

(56) References Cited

U.S. PATENT DOCUMENTS

| | | | |
|---|---|---|---|
| 5,365,468 A | 11/1994 | Kakubo et al. | 364/724.1 |
| 5,821,884 A | * 10/1998 | Lee | 341/61 |
| 5,859,787 A | 1/1999 | Wang et al. | 364/724.12 |
| 5,892,694 A | 4/1999 | Ott | 364/724.1 |
| 6,317,765 B1 | * 11/2001 | Page et al. | 708/313 |
| 6,362,755 B1 | * 3/2002 | Tinker | 341/61 |

OTHER PUBLICATIONS

Pohlmann, Ken C.; *Principals of Digital Audio* ($3^{rd}$ Ed.), pp. 336–338, published by McGraw–Hill, Inc., 1995.

Valimaki, Vesa; *Discrete–Time Modeling of Acoustic Tubes Using Fractional Delay Filters*, Chapter 3.3, Dec. 18, 1995.

* cited by examiner

*Primary Examiner*—Tan V. Mai
(74) *Attorney, Agent, or Firm*—Robert D. Marshall, Jr.; W. James Brady, III; Frederick J. Telecky, Jr.

(57) ABSTRACT

A method for converting sample rates includes obtaining coefficients from a sample rate conversion coefficient table. In this method, the table is generated prior to the real-time sample rate conversion using LaGrange Interpolation based on the ratio of the input sample rate to the output sample rate.

20 Claims, 4 Drawing Sheets

HIGH ORDER LAGRANGE SAMPLE RATE CONVERSION USING TABLES FOR IMPROVED EFFICIENCY

This application claims priority under 35 USC §119(e)(1) of Provisional Application No. 60/171,358, filed Dec. 22, 1999.

TECHNICAL FIELD OF THE INVENTION

This invention relates generally to the field of digital signal processing, and more particularly to converting a digital signal density to a different digital signal density.

BACKGROUND OF THE INVENTION

In digital systems, the digital signal consists of discrete data samples taken at periodic time intervals from a continuous analog source. These individual data samples make up the digital signal. The number of samples in a set period of time determines the accuracy of the digital signal that represents the original analog source. More samples in a period of time allows for a digital signal to more closely resemble the original analog source. The Sample Rate is the number of samples from a signal taken during a set period of time. For example, a 32,000 Hz sample rate has 32,000 samples per second. In digital systems with multiple components, it is often the case that different components require the signal to be sampled at different rates. For example, sometimes data is sampled at a lower frequency due to storage, processor, or bandwidth restrictions. These restrictions result in a digital signal that has a lower sampling rate than what is desired at the digital to analog conversion part of the system. When the desired signal sample rate is different than the source signal sample rate, the source signal is altered to match the desired sample rate. For this alteration to happen, new samples are added to or subtracted from the original signal. For example, if a 32,000 Hz sample rate is being converted to 44,100 Hz, 12,100 additional samples are created.

One method of sample rate conversion (SRC) is to perform interpolation on the original samples to create new samples. Interpolation is computation of a new value from the existing data. There are several methods of digital sample rate conversion. Some methods use more memory than others do, while others use more processor resources. Usually there is a trade-off between memory and processor resources for each method and application. In applications requiring less memory usage, LaGrange Interpolation is favorable since it does not require a large table to determine a new sample. However, new coefficients are calculated to determine new samples, making LaGrange Interpolation more processor intensive than other sample rate converters.

The system and apparatus of U.S. Pat. No. 5,892,694 uses the sample rate conversion method of upsampling the input stream by integer value M, convolving with a low pass filter to obtain the new samples, and then downsampling the output by integer N. It uses the least common multiple to upsample before downsampling. The problem with this method is that it uses a great deal of memory and computation.

The sampling frequency converter of U.S. Pat. No. 5,365,468 oversamples the input stream by a small integer amount, rather than by the least common multiple. It then takes the oversampled data and does polynomial interpolation to get new samples on either side of the desired output sample. It then performs linear interpolation between those two samples to get the output sample. This still requires a great deal of computation because it uses a polynomial interpolator and then linear interpolation, and the result is not as accurate as desired.

U.S. Pat. No. 5,859,787 discloses methods for resampling including convolving a given set of samples with the impulse response function of a low pass filter. The invention relates to arbitrary-ratio signal resampling techniques. Arbitrary-ratio resampling techniques can be applied to create a constant sampling rate output stream from a source where a sampling rate, is either not precisely known in advance or which may drift. The invention provides a method for resampling which convolves a given set of samples with the impulse response function of a low pass filter. The values of the impulse response used for the convolution calculation are computed at the time of resampling from a segmented polynomial approximating the impulse response. The segmented polynomial of the invention is represented, for each segment of the polynomial, by a number of coefficients. These coefficients are determined by fitting, in a least means squared sense, the polynomial to the impulse response function at a large number of points. This technique stores a large superset of impulse response samples as discrete coefficients in a memory device. Values of the impulse response used for convolution are calculated by an approximation that uses the stored impulse response. This approximation decreases the accuracy of the digital signal.

SUMMARY OF THE INVENTION

Accordingly, a need has arisen in the art for an improved sample rate conversion system. The present invention provides a method that substantially reduces or eliminates problems associated with prior data rate conversion systems.

In accordance with the present invention, a LaGrange Interpolation is used in a finite impulse response filter through which the input is convolved to produce the desired output signal. LaGrange Interpolation uses N+1 samples to achieve an $N^{th}$ order computation. Each interpolated sample is created from the weighted average of N+1 of the original samples. The weights of the weighted average are obtained by using calculated coefficients based on the position of the new sample. The distance of the new sample from the nearest input sample is used to generate unique coefficients. To determine how much to increment the distance, a ratio is defined. This ratio is the input sample rate divided by the output sample rate. The ratio is used in determining when to retrieve a new input sample, and the determination of the distance of the new sample from the input sample. Whenever a new sample is created, the ratio is added to a "distance counter." The distance counter stores the decimal portion of the results and whenever the distance counter exceeds 1, then 1 is subtracted and a new input sample is added to the set of N+1 input samples used in the interpolation process, and the oldest input sample is discarded. This distance counter determines when a new input sample is added, and the distance counter is also used to calculate the coefficients.

Calculating the coefficients uses approximately N squared plus N multiplications and N squared plus N additions to update the N+1 coefficients for each new output sample. These calculations can become very processor intensive when working with high orders. The multiplications are necessary for each sample created, and, therefore, high orders are impractical since it would use enormous processor resources.

Once the coefficients are determined, they are multiplied with an existing sample. The summation of the multiplications will yield the new sample. Once a new sample is found, the distance counter is incremented by the ratio and the process of determining the coefficients in obtaining a new sample is repeated.

In order to eliminate the processing requirements associated with the calculation of the coefficients, coefficients can be calculated prior to resampling and stored in a table. To avoid increased memory requirements, coefficients are only calculated for pre-determined values of the distance counter, which, in turn, are determined by the ratios of the known input and output sample rates. For a $16^{th}$ order LaGrange Interpolation, for example, 17 coefficients will be determined for each value of the distance counter.

Although the methods of this invention are particularly suitable for digital audio signals, in particular, real time processing at different output and input sample rates, the method may be used for any digital processing requirement, such as in cell phones, hard disk drives, voice over Internet devices and other devices.

BRIEF DESCRIPTION OF THE DRAWINGS

For a more complete understanding of the present invention and the advantages thereof, reference is now made to the following description taken in conjunction with the accompanying drawings, wherein like reference numerals represent like parts, in which.

DETAILED DESCRIPTION OF THE INVENTION

Figure 1:
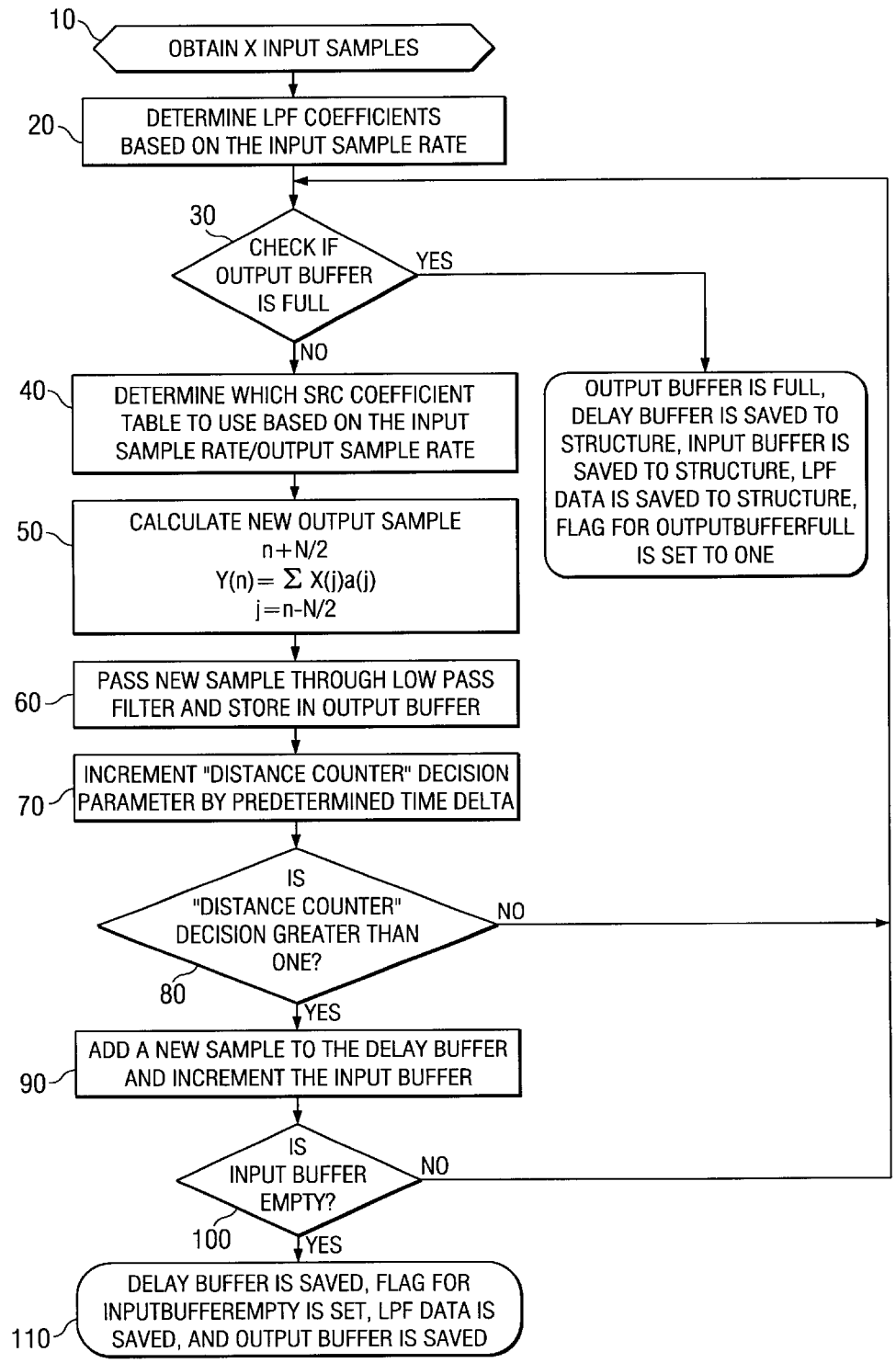
FIG. 1 is a flow diagram illustrating the upsampling method of this invention.

One embodiment of the present invention and its advantages is best understood by referring now in more detail to FIGS. 1 through 5. FIG. 1 shows a flow diagram of an upsampling routine. In step 10, X input samples are obtained. In step 20, low-pass filter (LPF) coefficients are determined based on the input sample rate. Because the incoming sample rate and the output sample rate are known, a look-up table is used to select the appropriate set of coefficients to be used in the low-pass filtering calculation method. The look-up table is generated prior to resampling and is based on a known set of input sample rates. In step 30, it is determined whether or not the output buffer is full. If it is full, the delay buffer (N+1 samples), the input buffer, and all the pertinent variables needed to perform the sample rate conversion are saved to a C structure resident in digital signal processor (DSP) memory. A software flag is set stating that the output buffer is full (outputbufferfull=1). If the output buffer is not full, the value of the distance counter is used to determine the appropriate set of sample rate conversion (SRC) coefficients to use. The distance counter is a value between 0 and 1 and equates to the distance between the positions of the desired output sample and the closest previous input sample. Improvements to the sample rate converter involved creating tables of fixed coefficients for various distance counter values. By storing these coefficients in tables in static DSP memory rather than calculating these coefficients "on-the-fly," the number of cycles needed to perform sample rate conversion can be reduced, thus enabling a faster real-time system. LaGrange Interpolation uses N+1 coefficients multiplied by N+1 input samples to calculate a new output sample. Since the incoming sample rate and the output sample rate are known, all ratios of input to output sample rates are also known. Thus, the calculation method of the present disclosure is based on coefficients that are calculated based on these ratios and the LaGrange coefficient equations. By storing only the coefficients corresponding to the discrete set of distance-counter values, the memory requirements of the SRC calculation method are also minimized.

In step 50, each of the N+1 coefficients is multiplied with the N+1 selected input samples and added together (i.e., the sum of each product is taken) to obtain the new output sample. In step 60, the new output sample is passed through the low-pass filter and stored in the output buffer. Convolving the output of the SRC with the LPF helps to eliminate any high-frequency artifacts that may have been introduced by LaGrange Interpolation. LaGrange Interpolation introduces these artifacts as a by-product, and, thus, these artifacts need to be eliminated to reduce the amount of audible distortion produced during the conversion process (see FIG. 4). In step 70, the "distance counter" decision parameter is incremented by a ratio of the input sample rate divided by the output sample rate, also referred to as the time delta. This time delta is added to a running counter called the distance counter. In step 80, it is determined whether the distance counter value is greater than 1. If the distance counter is less than 1, the process goes back to step 30. If the distance counter is greater than or equal to 1, the process continues to step 90. For example, at the beginning of the calculation method, the distance counter would equal zero. If the input sample rate was 8 kHz, and the desired output sample rate was 48 kHz, 8000/48000 would be added to zero (in step 70) and stored to the distance counter, resulting in the distance counter equal to 0.166 or 8/48. Because 0.166 is less than 1, the process would repeat from step 30. The next iteration of the calculation method would start with distance counter equal to 0.166. When it reached step 70 again, another 8000/48000 would be added to this value, resulting in the distance counter equal to 0.333. Again, steps 30–80 would be repeated until the distance counter value was greater than or equal to 1.

In step 90, a new sample is added to the delay buffer and the input buffer is incremented. If the distance counter is greater than or equal to 1, a new sample is moved into the delay buffer memory, and the current sample input pointer is moved to the next sample in the input buffer. Then 1 is subtracted from the distance counter so that the distance counter remains in the desired range of less than 1, but greater than or equal to 0. Continuing the previous example, the distance counter would equal to 1 after the sixth time through the loop since 6 multiplied by 8/48 is 1. Then 1 would be subtracted, giving a distance counter of 0. In step 100, it is determined whether the input buffer is empty. If it is not empty, the process goes back to step 30. If the input buffer is empty, in step 110, the delay buffer is saved, the output buffer is saved, the "inputbufferempty" flag is set (inputbufferisempty=1), and the LPF state values are saved. There are no more input samples to use, so the pertinent variables as outlined in step 110 are saved and a flag is set to tell the system that there are no more input samples. The process then ends.

Figure 2:
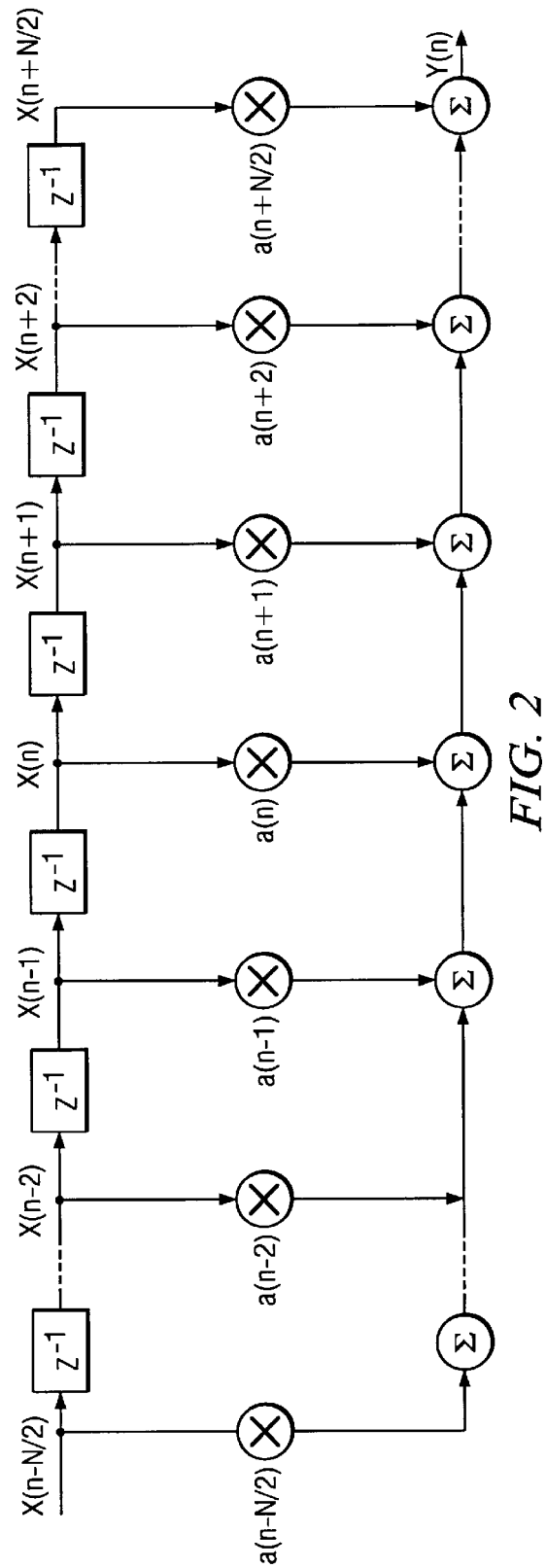
FIG. 2 illustrates a block diagram of a $N^{th}$ order LaGrange Interpolation.

FIG. 2 illustrates the LaGrange Interpolation Calculation method. LaGrange Interpolation is a finite impulse response filter that takes in equal future and past samples to generate a new sample. It is a polynomial interpolation method that uses N+1 samples to achieve an $N^{th}$ Order computation. The new interpolated sample is created from the weighted average of the original samples. The weights of the weighted average are obtained by calculating the coefficients based on the position of the new sample in relation to the original samples. If a new sample is closer to Sample A than Sample B, then the coefficient multiplied with Sample A is larger than the coefficient multiplied with Sample B. The resulting products of the coefficients and the samples are added together to yield a new sample. The diagram illustrates the $N^{th}$ order LaGrange Interpolation new sample $$Y(n) = \sum_{j=n-\frac{N}{2}}^{j=n+\frac{N}{2}} X(j)a(j).$$

Figure 3:
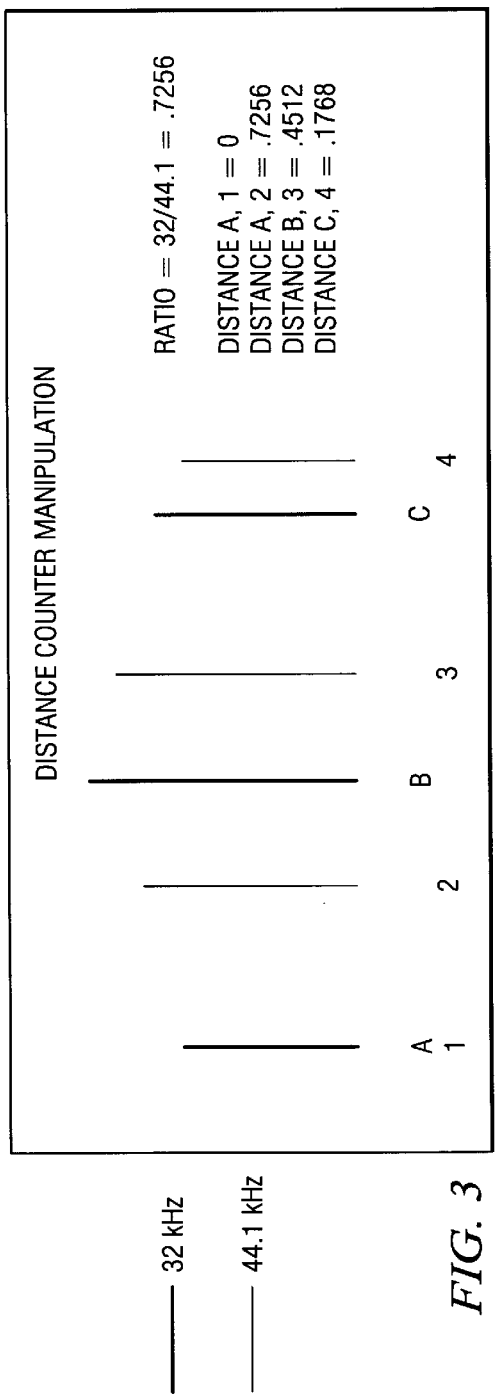
FIG. 3 illustrates distance counter manipulation used with the present invention.

FIG. 3 illustrates the distance counter manipulation used in the method described herein. Coefficients are generated to interpolate new samples from the input samples. The distance the new sample is from the input sample is determined to generate these unique coefficients. To determine how much to increment the distance counter, a ratio is defined. This ratio is the Input Sample Rate/Output Sample Rate. For example, if 32 kHz is being converted to 48 kHz sample rate, the ratio of old to new sample rate is 32/48, or 0.666. Whenever a new sample is created, the ratio is added to a "distance counter." The distance counter stores the decimal portion of the results and when the distance counter is equal to or exceeds 1, 1 is subtracted and a new input sample is added. For example, the distance counter equals zero for a first output sample. The distance counter equals 0.666 for a second output sample. The distance counter equals 0.333 for the third output sample.

Calculating the coefficients uses approximately $N^2+N$ multiplications and $N^2+N$ additions for the N+1 coefficients for each sample. Once the coefficients are determined, they are multiplied with existing samples in the delay buffer. The summation of the multiplications of the samples and coefficients will yield, the new sample, $$Y(n) = \sum_{j=n-\frac{N}{2}}^{j=n+\frac{N}{2}} X(j)a(j).$$

Once a new sample is found, the distance counter is incremented by the ratio and the process of determining the coefficients and obtaining a new sample is repeated.

Figure 4:
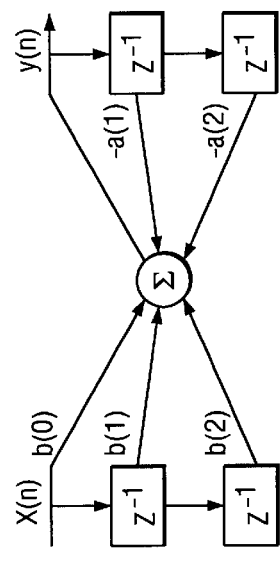
FIG. 4 illustrates a block diagram of a $2^{nd}$ order elliptic low pass filter.
Figure 5:
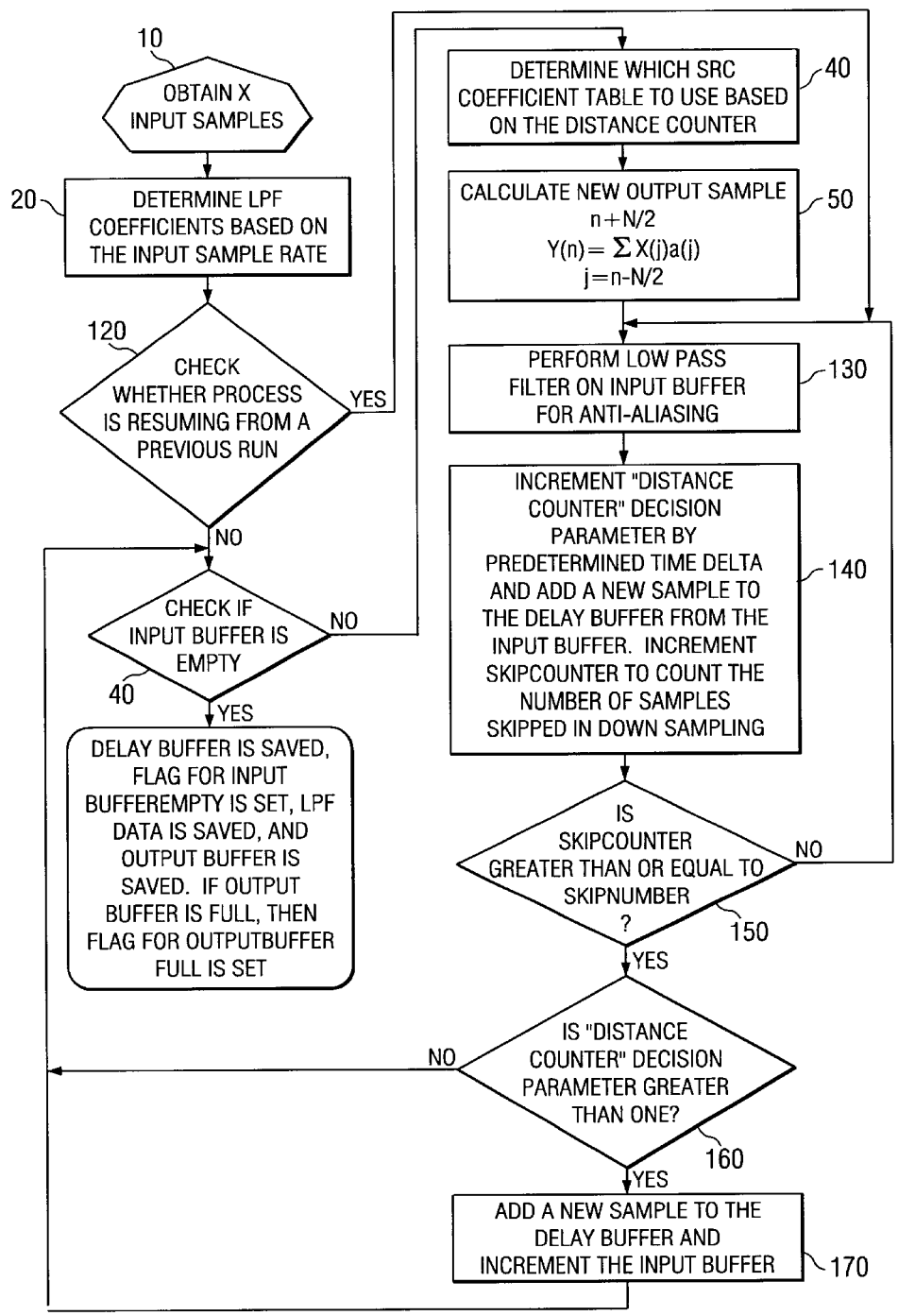
FIG. 5 is a flow diagram illustrating the downsampling method of this invention.

FIG. 4 illustrates a block diagram of a $2^{nd}$ order elliptic low pass filter.

The same method can also be used to down-sample with LaGrange Interpolation. The downsampling method of the present invention and its advantages are better understood by referring now in more detail to FIG. 5. In step 10, X input samples are obtained. In step 20, Low-pass filter (LPF) coefficients are determined based on the input sample rate. Because the incoming sample rate and the output sample rate are known, a look-up table is used to relate the ratio of the sample rates to select the appropriate set of coefficients to be used in the low-pass filtering calculation method. The look-up table is generated prior to resampling and is based on a known set of input sample rates. In step 30, it is determined whether the method is resuming from a previous run. This determination is made with the use of a skipcounter. If the skipcounter indicates that it is the first time running the downsampling rate converter, then the process continues to step 40; otherwise, the process skips to step 70.

In step 40, it is determined whether the input buffer is empty. If the input buffer is empty, the delay buffer is saved, the flag for inputbufferempty is set, the LPF data is saved, and the output buffer is saved. There are no more input samples to use, so the pertinent variables are saved and a flag is set to tell the system that there are no more samples. If the output buffer is full, then the flag for outputbufferfull is set. The process then ends.

If the input buffer is not empty, in step 50, it is determined which SRC coefficient table to use based on the distance counter. The distance counter starts at a value of 0 and lies between 0 and 1. Based on the value of the distance counter, the appropriate set of sample rate converter coefficients to be used in the LaGrange interpolator are selected. By storing a predetermined set of interpolation coefficients, the memory and millions of instructions per second (MIPs) requirements of an SRC calculation method, using LaGrange Interpolation on a fixed point DSP system, are reduced. By storing these coefficients in static DSP memory rather than calculating these coefficients "on-the-fly," the number of cycles needed to perform sample rate conversion can be reduced, thus enabling a faster real-time system. LaGrange Interpolation uses N+1 coefficients multiplied by N+1 input samples to calculate a new output sample. Since the incoming sample rate and the output sample rate are known, all ratios of input to output sample rates are also known. Thus, the calculation method of the present disclosure is based on coefficients that are calculated based on these ratios and the LaGrange coefficient equations.

In step 60, each of the N+1 coefficients is multiplied with the N+1 selected input samples and then added together (i.e., the sum of each product is taken) to obtain the new output sample. Step 70 involves the process of low-pass filtering the new input samples to avoid aliasing or distorting artifacts that would be introduced in the sample rate conversion phase. A sum-of-products-type calculation method is used to multiply LPF coefficients with the input samples, which acts to remove frequency content that would otherwise distort the output signal (see FIG. 4). In step 80, the "distance counter" decision parameter is incremented by a ratio of the input sample rate divided by the output sample rate, which is also known as the time delta. This time delta is added to a running counter called the distance counter. The skipcounter is also incremented by 1. The skipcounter keeps track of how many input samples have been skipped. Finally, a new input sample is added to the delay buffer, and the oldest sample in the delay buffer is discarded. In step 90, it is determined whether the skipcounter is greater than or equal to the skipnumber. The skipcounter keeps track of how many input samples have been skipped in the downsampling process. If the correct number of samples have been skipped, then the process continues to step 100; otherwise, the process goes back to step 70. In step 100, it is determined whether the distance counter value is greater than 1. If the distance counter is less than or equal to 1, the process goes back to step 40. If the distance counter is greater than 1, the process continues to step 110.

For example, in the conversion of a 48 kHz sample rate to an 8 kHz sample rate, at the beginning of the calculation method, the distance counter would equal zero and the skipcounter would equal 0. The skipnumber is equal to 6 since only every sixth sample is required. The skipnumber is derived from the ratio of the input sample rate to output sample rate (48000/8000=6.00). The skipnumber is comprised of the part of the ratio that is greater than 1, which in this case is "6." The ratio used to increment the distance counter is found to be "0.00" since it is comprised of the part of the ratio that is less than 1. The 0.00 would be added to zero (in step 80) and stored to the distance counter, resulting in the distance counter equal to 0. The skipcounter is also incremented by 1 in step 80 and a new input sample is added to the delay buffer. Steps 70–90 would be repeated until the skipcounter equals the skipnumber. Once that event occurs, then the process continues to step 100 and the skipcounter is reset to "0."

In step 110, a new sample is added to the delay buffer and the input buffer is incremented. If the distance counter is greater than or equal to 1, a new sample is moved into the delay buffer memory, and the current sample input pointer is moved to the next sample in the input buffer. Then 1 is subtracted from the distance counter so that the distance counter remains in the desired range of less than 1, but greater than or equal to 0. Continuing the previous example, the distance counter would equal to 0 throughout the process since the ratio is 0. The skipcounter would constantly be changing from 1 to 5 depending on how many samples were skipped in the downsampling process. After step 110, the process goes back to step 40. Again, if the input buffer is not empty, the process continues to step 50. But if the input buffer is empty, the delay buffer is saved, the output buffer is saved, the "inputbufferempty" flag is set (inputbufferisempty=1), and the LPF data is saved. There are no more input samples to use, so the pertinent variables are saved and a flag is set to tell the system that there are no more input samples (inputbufferisempty=1) and the process is ended.

Although the present invention has been described in detail, it should be understood that various changes, substitutions, and alterations can be made hereto without departing from the spirit and scope of the invention as defined by the appended claims.

What is claimed is:

1. A method for real-time conversion of a sample rate of a digitized signal comprising the steps of:
    determining an output sample rate;
    choosing an input sample rate from a list of predetermined input sample rates;
    referring to a sample rate conversion coefficient table for a ratio of the input sample rate to the output sample rate;
    obtaining coefficients from the coefficient table; and
    convolving the digitized signal with the coefficients obtained from the coefficient table.

2. The method of claim 1, wherein the coefficient table is calculated by using LaGrange Interpolation.

3. The method of claim 2, wherein the ratio of the input sample rate to the output sample rate determines a distance counter, and wherein the distance counter determines a distance between an input sample position and an output sample position.

4. The method of claim 3, wherein the distance counter has a starting value of 0, and wherein the distance counter is incremented by the ratio of the input sample rate to the output sample rate each time a new input sample is created.

5. The method of claim 4, wherein the distance counter maintains a value between 0 and 1.

6. The method of claim 5, wherein a value of 1 is subtracted from the distance counter if the distance counter value is equal to or exceeds 1.

7. The method of claim 6, wherein said convolving of the digitized signal comprises the step of multiplying N+1 coefficients with N+1 input samples and adding them together for each new output sample.

8. The method of claim 2, wherein:
    said step of calculating the coefficient table using LaGrange Interpolation includes
        selecting multiple input sample rates,
        selecting an output sample rate,
        calculating a discrete set of output sample positions relative to a set of input samples based on the input sample and output sample rates, and
        calculating N+1 coefficients for each output sample position by LaGrange Interpolation, where N is the order of interpolation.

9. The method of claim 1, wherein said convolving of the digitized signal comprises the step of multiplying N+1 coefficients with N+1 input samples and adding them together for each new output sample.

10. The method of claim 1, wherein the ratio of the input sample rate to the output sample rate determines a distance counter, and wherein the distance counter determines a distance between an input sample position and an output sample position.

11. A method for real-time conversion of a sample rate of a digitized signal comprising the steps of:
    determining an input sample rate;
    choosing an output sample rate from a list of predetermined output sample rates;
    referring to a sample rate conversion coefficient table for a ratio of the input sample rate to the output sample rate;
    obtaining coefficients from the coefficient table; and
    convolving the digitized signal with the coefficients obtained from the coefficient table.

12. The method of claim 11, wherein the coefficient table is calculated by using LaGrange Interpolation.

13. The method of claim 12, wherein the ratio of the input sample rate to the output sample rate determines a distance counter, and wherein the distance counter determines a distance between an input sample position and an output sample position.

14. The method of claim 13, wherein the distance counter has a starting value of 0, and wherein the distance counter is incremented by the ratio of the input sample rate to the output sample rate each time a new input sample is created.

15. The method of claim 14, wherein the distance counter maintains a value between 0 and 1.

16. The method of claim 15, wherein a value of 1 is subtracted from the distance counter if the distance counter value is equal to or exceeds 1.

17. The method of claim 16, wherein said convolving of the digitized signal comprises the step of multiplying N+1 coefficients with N+1 input samples and adding them together for each new output sample.

18. The method of claim 12, wherein:
    said step of calculating the coefficient table using LaGrange Interpolation includes selecting multiple output sample rates,
        selecting an input sample rate,
        calculating a discrete set of output sample positions relative to a set of input samples based on the output sample and input sample rates, calculating N+1 coefficients for each input sample position by LaGrange Interpolation, where N is the order of interpolation.

19. The method of claim 11, wherein said convolving of the digitized signal comprises the step of multiplying N+1 coefficients with N+1 input samples and adding them together for each new output sample.

20. The method of claim 11, wherein the ratio of the input sample rate to the output sample rate determines a distance counter, and wherein the distance counter determines a distance between an input sample position and an output sample position.

* * * * *